(12) United States Patent
Sun et al.

(10) Patent No.: US 9,054,314 B2
(45) Date of Patent: Jun. 9, 2015

(54) LASER INDUCED THERMAL IMAGING MASK, LASER IRRADIATION APPARATUS INCLUDING THE SAME, AND METHOD OF MANUFACTURING ORGANIC LIGHT EMITTING DEVICE BY USING THE SAME

(75) Inventors: Jin-Won Sun, Yongin (KR); Tae-Min Kang, Yongin (KR); Sok-Won Noh, Yongin (KR); Min-Chul Suh, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 639 days.

(21) Appl. No.: 13/223,158

(22) Filed: Aug. 31, 2011

(65) Prior Publication Data

US 2012/0099615 A1    Apr. 26, 2012

(30) Foreign Application Priority Data

Oct. 22, 2010    (KR) .................... 10-2010-0103668

(51) Int. Cl.
*B05D 5/12* (2006.01)
*H01L 51/00* (2006.01)
*H01L 51/56* (2006.01)
*G03F 7/20* (2006.01)
*G03F 7/34* (2006.01)

(52) U.S. Cl.
CPC ............ *H01L 51/0013* (2013.01); *H01L 51/56* (2013.01); *Y02E 10/549* (2013.01); *G03F 7/343* (2013.01); *G03F 7/2035* (2013.01)

(58) Field of Classification Search
CPC .................................................. H01L 51/0013
USPC ........................................... 427/66, 554, 557
See application file for complete search history.

(56) References Cited

U.S. PATENT DOCUMENTS

| 6,943,816 | B2 | 9/2005 | Pierson |
| 2006/0063098 | A1 | 3/2006 | Lee et al. |
| 2007/0034866 | A1 | 2/2007 | Lee et al. |
| 2007/0048436 | A1 | 3/2007 | Kang et al. |
| 2007/0178402 | A1* | 8/2007 | Lee et al. ....................... 430/199 |
| 2009/0142510 | A1* | 6/2009 | Takahashi et al. ............. 427/557 |
| 2009/0202950 | A1 | 8/2009 | Lee et al. |

FOREIGN PATENT DOCUMENTS

| KR | 10-2006-0026788 | 3/2006 |
| KR | 10-0645534 | 11/2006 |
| KR | 10-2007-0024015 | 3/2007 |

* cited by examiner

*Primary Examiner* — Austin Murata
(74) *Attorney, Agent, or Firm* — Robert E. Bushnell, Esq.

(57) ABSTRACT

Provided are a laser induced thermal imaging (LITI) mask, a laser irradiation apparatus including the LITI mask, and a method of manufacturing an organic light emitting device by using the LITI mask. The LITI mask including an opening corresponding to a pixel region and an opening corresponding to an edge of a pixel is used to form an organic layer in an upper portion of a substrate of an organic light emitting device, thereby transferring the organic layer to an edge of the pixel region.

11 Claims, 9 Drawing Sheets

LASER INDUCED THERMAL IMAGING MASK, LASER IRRADIATION APPARATUS INCLUDING THE SAME, AND METHOD OF MANUFACTURING ORGANIC LIGHT EMITTING DEVICE BY USING THE SAME

CLAIM OF PRIORITY

This application makes reference to, incorporates the same herein, and claims all benefits accruing under 35 U.S.C. §119 from an application earlier filed in the Korean Intellectual Property Office on 22 Oct. 2010 and there duly assigned Serial No. 10-2010-0103668.

BACKGROUND OF THE INVENTION

1. Field of the Invention

The present invention relates to a method of manufacturing an organic light emitting device, and more particularly, to a method of manufacturing an organic light emitting device by using a laser induced thermal imaging (LITI) method.

2. Description of the Related Art

An organic light emitting display device, which is a flat panel display device, includes an anode, a cathode, and an intermediate layer including at least an organic emission layer interposed between the anode and the cathode. The organic light emitting display device is a self-emissive display device, has a wide viewing angle, high contrast ratio, and high response speed, and thus is considered to be a next-generation display device. The organic light emitting display device may further include at least one organic layer in addition to a hole injecting layer (HIL), a hole transporting layer (HTL), an electron transporting layer (ETL), and an electron injecting layer (EIL) besides the organic emission layer, depending on whether the organic emission layer is formed of a polymer organic material or a small-molecule organic material.

In order for the organic light emitting display device to achieve full color images, an organic layer needs to be patterned. Examples of the patterning method include a shadow mask method for small-molecule organic light emitting display devices, and an ink-jet printing method or a laser induced thermal imaging (LITI) method for polymer organic light emitting display devices. The LITI method converts laser light into thermal energy, transfers a transfer layer onto a substrate of an organic light emitting display device by using the converted thermal energy, and forms red (R), green (G), and blue (B) organic layers. The LITI method is capable of minutely patterning an organic layer, may be used on a large surface, and is advantageous in achieving a high resolution.

FIGS. 1A and 1B are schematic cross-sectional views for explaining a conventional LITI method. Referring to FIG. 1A, the LITI method prepares an acceptor substrate 40 including a pixel electrode 43 and a pixel definition layer 45 formed on an upper portion of a substrate 41.

Thereafter, a donor film 30 is laminated on an upper portion of the acceptor substrate 40. The donor film 30 includes a base film 31, a light to heat conversion (LTHC) layer 33, and a transfer layer 35.

A laser beam emitted from a light source 10 is irradiated onto the acceptor substrate 40 through a patterned mask 20. The laser beam is absorbed into the LTHC layer 33 of the donor film 30, is converted into thermal energy, and thus the donor film 30 expands according to a shape of the mask 20. In this regard, referring to FIG. 1B, a rectangular opening portion is used as the mask 20 which is patterned so as to correspond to a pixel region, so that an intensity of energy irradiated onto an edge of a pixel is relatively lower than that of the energy irradiated onto a center of the pixel. Thus, thermal conductivity is highest in a center of the donor film 30 and is rapidly lowered the closer to an edge of the donor film 30 that contacts the acceptor substrate 40. This results in the weakness of transferring a transfer layer onto the pixel edge, which deteriorates performance of a device.

SUMMARY OF THE INVENTION

The present invention provides a mask, which is capable of preventing defects occurring in a pattern of an organic layer when the organic layer is formed by using a laser induced thermal imaging (LITI) method, a laser irradiation apparatus including the mask, and a method of manufacturing an organic light emitting device by using the mask.

According to an aspect of the present invention, there is provided a method of manufacturing an organic light emitting device, the method including: providing an acceptor substrate including a first electrode and a pixel definition layer that defines a pixel region; disposing a donor film on an upper portion of the acceptor substrate; disposing a mask including opening portions on an upper portion of the donor film where the opening portions of the mask correspond to the pixel region and the pixel definition layer of an edge of the pixel region; and forming an organic layer by applying a laser beam to the mask and transferring a transfer material of the donor film onto the first electrode. The first electrode is exposed through the pixel defining layer.

The opening portions of the mask may include a first opening portion corresponding to the pixel region and second opening portions that correspond to the edge of the pixel region and are formed to the left and right of the first opening portion in a direction in which the laser beam is scanned. The second opening portions may be formed to include a plurality of slits.

The second opening portions may be longer than the first opening portion in the direction in which the laser beam is scanned.

A laser dose per unit area, which is transmitted to the edge of the pixel region, may be higher than a laser dose per unit area, which is transmitted to the pixel region.

The disposing of the donor film on the upper portion of the acceptor substrate may include: laminating the donor film on the acceptor substrate.

The donor film may include: a base film; a light to heat conversion (LTHC) layer to be formed in one surface of the base film, to absorb light, and to convert the light into heat; and a transfer layer formed in one surface of the LTHC layer by using the transfer material. The transfer layer may be one single layer or one or more multilayers selected from the group consisting of a hole injecting layer (HIL), a hole transporting layer (HTL), an electroluminescent layer (ELL), a hole blocking layer (HBL), an electron transporting layer (ETL), and an electron injecting layer (EIL).

The disposing of the mask may include: disposing the mask to directly contact the donor film or to be spaced apart from the donor film.

The method may further include: forming a second electrode on an upper portion of the organic layer.

The laser beam may be a linear laser beam.

According to another aspect of the present invention, there is provided a laser induced thermal imaging (LITI) mask used to form an organic layer in a pixel region, the LITI mask including: an opening portion corresponding to the pixel region and a pixel definition layer of an edge of the pixel region; and a shielding portion for reflecting or blocking the laser beam. A laser beam passed through the opening portion.

According to another aspect of the present invention, there is provided a laser irradiation apparatus including: a light source for irradiating a target with a laser beam; and a mask comprising a shielding portion that selectively blocks or reflects the laser beam, and an opening portion that corresponds to the pixel region and a pixel definition layer of an edge of the pixel region. The laser beam passes through the opening portion.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1A:
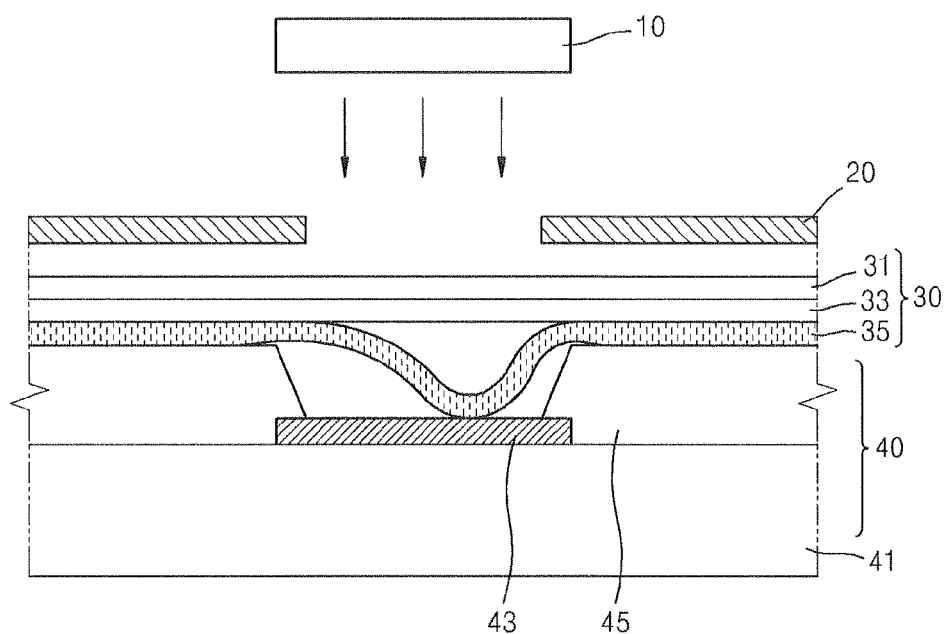
FIGS. 1A and 1B are schematic cross-sectional views for explaining a conventional laser induced thermal imaging (LITI) method.
Figure 1B:
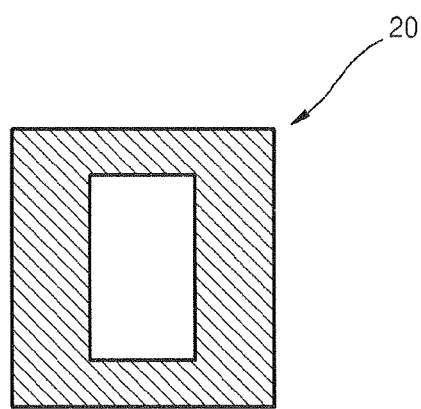

Hereinafter, the present invention will now be described more fully with reference to the accompanying drawings, in which exemplary embodiments of the invention are shown. While describing the present invention, detailed descriptions about related well known functions or configurations that may obscure the points of the present invention are omitted. Like reference numerals in the drawings denote like elements. In the accompanying drawings, thicknesses and sizes of layers and regions are exaggerated for clarity.

Figure 2:
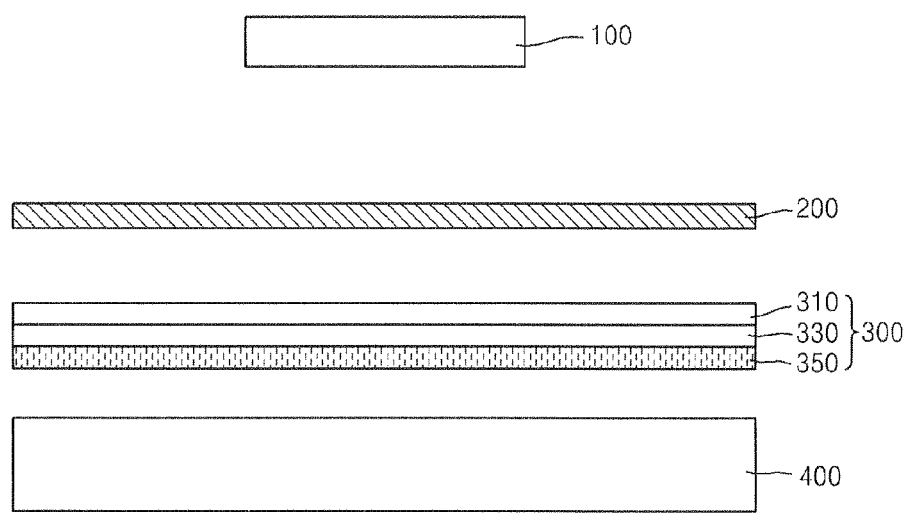
FIG. 2 is a schematic cross-sectional view for explaining a method of forming an organic layer by using a LITI method according to an embodiment of the present invention.
Figure 3:
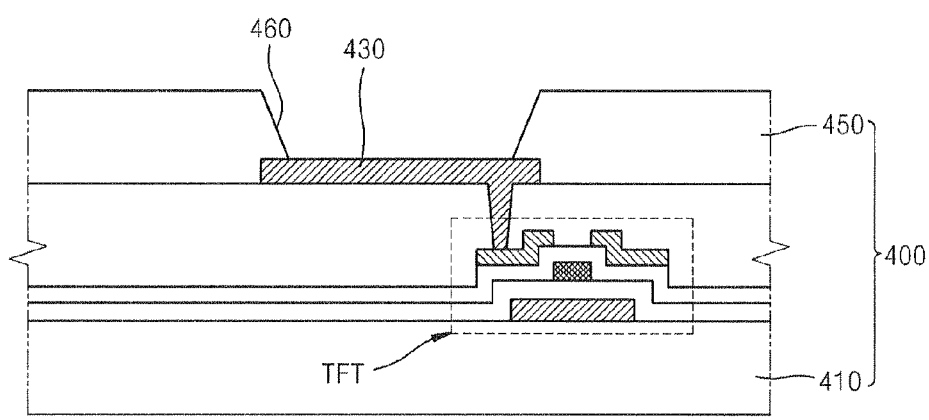
FIG. 3 is a schematic cross-sectional view of a pixel of an acceptor substrate of FIG. 2.

FIG. 2 is a schematic cross-sectional view for explaining a method of forming an organic layer by using a laser induced thermal imaging (LITI) method according to an embodiment of the present invention. FIG. 3 is a schematic cross-sectional view of a pixel of an acceptor substrate 400 of FIG. 2.

Referring to FIG. 2, the method of forming the organic layer by using the LITI method needs a light source 100, a mask 200, a donor film 300, and the substrate of an organic light emitting device (hereinafter referred to as the "acceptor substrate") 400.

A laser beam emitted from the light source 100 is applied onto a predetermined region of the acceptor substrate 400 through an opening portion of a patterned mask 200. The laser beam may partially heat a region narrower than the opening portion of the mask 200. The light source 100 may use oscillations of one or more lasers selected from the group consisting of a gas laser, such as an Ar laser, a Kr laser, an excimer laser, and a laser having a medium as one or more dopants selected from a group consisting of Nd, Yb, Cr, Ti, Ho, Er, Tm, and Ta that are added to mono crystalline TAG, YVO4, Mg2SiO4, YAl3, and GdVO4, or polycrystalline (ceramic) YAG, Y2O3, YVO4, YAl3, and GdVO4, a glass laser, a ruby laser, an alexandrite laser, a Ti:sapphire laser, a copper vapor laser, and a gold vapor laser. The laser beam may be a rectangular beam or a linear beam that easily collects light, rather than a surface-shaped beam of a wide area that irradiates an overall surface of the acceptor substrate 400.

The mask 200 is disposed between the light source 100 and the donor film 300, and is a light control member for selectively blocking or reflecting the laser beam transmitted from the light source 100. The mask 200 includes the opening portion through which the laser beam passes and a shielding portion for blocking or reflecting the laser beam.

Since the opening portion of the mask 200 does not pass through a deposition material, the mask 200 may be thick, unlike a deposition mask, so that the mask 200 is not easily affected by heat and prevents the laser beam from diffracting.

The mask 200 may be formed of a material capable of enduring intensity of laser light, and may be formed of a metal material of a low rate of thermal expansion that is not easily deformed by heat, such as a metal having a high melting point, such as tungsten, tantalum, chrome, nickel, and molybdenum, or an alloy containing tungsten, tantalum, chrome, nickel, and molybdenum, stainless steel, inconel, or hastelloy. The mask 200 may be formed of a material having the same thermal expansion coefficient as that of a material used for the donor film 300. When the laser beam is applied, although the mask 200 is heated, the mask 200 and the donor film 300 expand in the same way so that the mask 200 and the donor film 300 do not easily misaligned from each other.

The mask 200 may include opening portions that correspond to a pixel and a pixel definition layer formed in the edge of the pixel. The mask 200 may include a first opening portion corresponding to the pixel, and two second opening portions that are spaced apart from the first opening portion by a predetermined gap in a direction in which the laser beam is scanned and are disposed to the left and right of the first opening portion and correspond to the pixel definition layer formed in the edge of the pixel. Such first and second opening portions enable further irradiation of the laser beam onto the edge of the pixel, thereby widening an expansion region of the donor film 300 and accordingly preventing an organic layer from not being transferred onto the edge of the pixel. The mask 200 will be described in more detail later.

The donor film 300 includes a base film 310, a light to heat conversion (LTHC) layer 330, and a transfer layer 350. The donor film 300 is laminated onto the acceptor substrate 400. A laser beam emitted from the light source 100 is absorbed by the LTHC layer 330, and is converted into thermal energy. This thermal energy changes an adhesion force between the LTHC layer 330, the transfer layer 350, and the acceptor substrate 400 so that material of the transfer layer 350 formed on the donor film 300 is transferred onto the acceptor substrate 400, and thus the organic layer is formed on the acceptor substrate 400. More specifically, the transfer layer 350 is detached from the donor film 300 and is transferred onto the acceptor substrate 400, so that the organic layer (not shown) is formed.

Referring to FIG. 3, the acceptor substrate 400 includes a first electrode 430 that is patterned in an upper portion of the substrate 410, and a pixel definition layer (PDL) 450 that defines a pixel (or an active region) in an upper portion of the first electrode 430 and is formed of an insulation material for insulating pixels. The donor film 300 forms the organic layer including the R, G and B organic light emission layers on the upper portion of the first electrode 430. A thin film transistor (TFT) may be formed on the upper portion of the substrate 410 as a driving element that is electrically connected to the first electrode 430. The TFT may include a semiconductor layer including a source/drain region and a channel region, a source/drain electrode connected to the source/drain region, and a gate electrode corresponding to the channel region.

The TFT may have a top gate structure in which the semiconductor layer is formed on the substrate 410, and the gate electrode is formed on an upper portion of the semiconductor layer, and a bottom gate structure in which the gate electrode is formed on the substrate 410 and the semiconductor layer is formed on an upper portion of the gate electrode. FIG. 3 shows the TFT having the top gate structure.

FIGS. 4A through 4F are plan views of a mask having various patterns used to form an organic layer by using a LITI method according to an embodiment of the present invention.

Figure 4A:
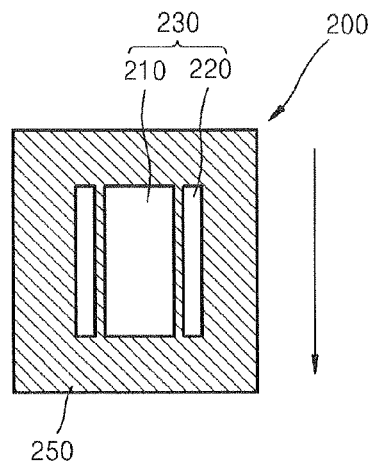
FIGS. 4A through 4F are plan views of a mask having various patterns used to form an organic layer by using a LITI method according to an embodiment of the present invention.
Figure 4B:
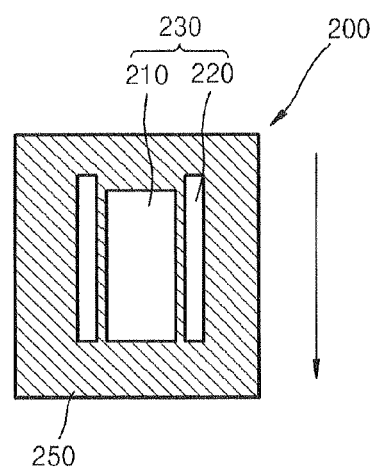
Figure 4C:
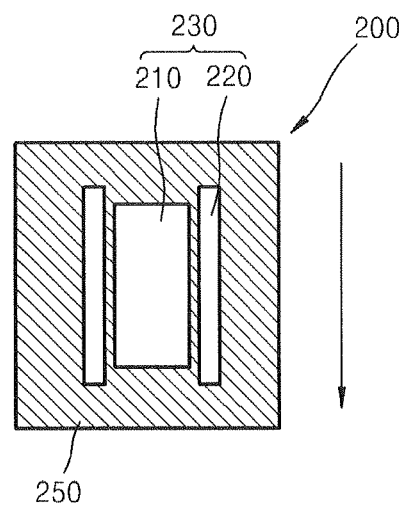

Referring to FIGS. 4A through 4C, the mask 200 includes the opening portion 230 and the shielding portion 250. The opening portion 230 includes a first opening portion 210 and two second opening portions 220.

The size of the first opening portion 210 may change according to a distance between the mask 200 and the acceptor substrate 400, and may be the same as or smaller than that of a single pixel, which prevents colors of neighboring pixels from being mixed. The first opening portion 210 may have a rectangular shape including two short facing sides and two long facing sides in a direction in which a laser beam is scanned.

The second opening portions 220 are formed to the left and right of the first opening portion 210 in the direction (indicated by an arrow) in which the laser beam is scanned. The second opening portions 220 correspond to a pixel definition layer in an edge of a pixel. Lengths (in the direction in which the laser beam is scanned) of the second opening portions 220 may be the same as that of the first opening portion 210 as shown in FIG. 4A, and may be greater than that of the first opening portion 210 by patterning at least one of upper and lower sides of the second openings portions 220 to be longer as shown in FIGS. 4B and 4C. Widths (a direction perpendicular to the direction in which the laser beam is scanned) of the second opening portions 220 may be set in a range that does not affect neighboring pixels by having a part of the transfer layer 350 remain by irradiation of the laser beam that passes through the second opening portions 220, and may be sufficient for heat to be absorbed by the donor film 300 of a region corresponding to the second opening portions 220 by irradiating the laser beam in a linear shape.

Figure 4D:
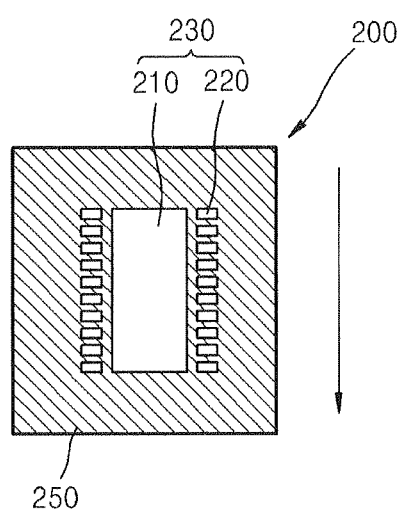
Figure 4E:
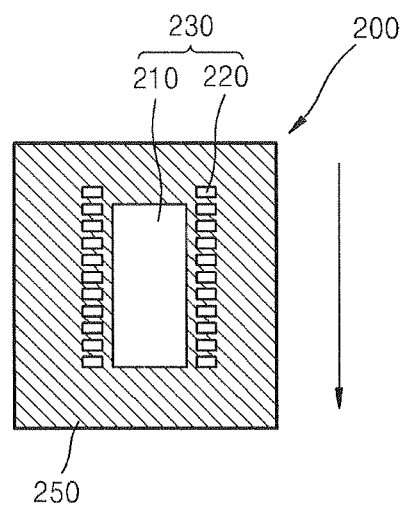
Figure 4F:
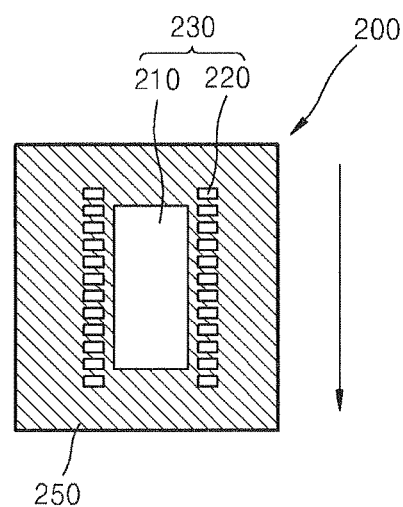

Referring to FIGS. 4D through 4F, the mask 200 includes the opening portion 230 including the first opening portion 210 and the second opening portions 220 that are formed as a plurality of slits, and the shielding portion 250.

The size of the first opening portion 210 may change according to a distance between the mask 200 and the acceptor substrate 400, and may be the same as or smaller than that of a single pixel, which prevents colors of neighboring pixels from being mixed. The first opening portion 210 may have a rectangular shape including two short facing sides and two long facing sides in a direction in which a laser beam is scanned.

The second opening portions 220 are formed as slits to the left and right of the first opening portion 210 in the direction (indicated by an arrow) in which the laser beam is scanned. The second opening portions 220 correspond to a pixel definition layer in an edge of a pixel. The second opening portions 220 are formed as the slits, which facilitates transferring of the transfer layer 350 and forming of an organic layer. Lengths (the direction in which the laser beam is scanned) of the second opening portions 220 may be the same as that of the first opening portion 210 as shown in FIG. 4D, and may be greater than that of the first opening portion 210 by further patterning slits in at least one of upper and lower sides of the second openings portions 220 as shown in FIGS. 4E and 4F. Widths (a direction perpendicular to the direction in which the laser beam is scanned) of the second opening portions 220 may be set in a range that does not affect neighboring pixels by having a part of the transfer layer 350 remain by irradiation of the laser beam that passes the second opening portions 220, and may be sufficient for heat to be absorbed by the donor film 300 of a region corresponding to the second opening portions 220 by irradiating the laser beam in a linear shape.

If the laser beam is applied by using a mask that is smaller than a pixel, an intensity of energy transferred onto the edge of the pixel is relatively lower than that of the energy transferred onto a center of the pixel. Thus, when the donor film 300 expands, thermal conductivity by laser is highest in the center of the pixel and is rapidly lowered at the edge of the pixel where the donor film 300 and the acceptor substrate 400 contact each other. It is also difficult for the donor film 300 to correspond to the pixel due to a step geometry at the edge of the pixel. Thus, a center portion of the donor film 300 corresponding to the pixel and left and right end portions thereof expand in different ways, and thus an organic substance is not transferred to the pixel. If an intensity of laser irradiation energy increases at a small mask, the intensity of the laser irradiation energy of the center of the pixel is relatively high, which degrades an organic substance that is to be transferred.

Therefore, as shown in FIGS. 4A through 4F, according to the mask 200 including the first opening portion 210 and the second opening portions 220 formed on an upper portion of a pixel definition layer of the edge of the pixel, the donor film 300 of the edge of the pixel absorbs heat and expands more widely, thereby preventing transferring of the organic substance to the edge of the pixel from not being transferred.

The light source 100 and the mask 200 may be integrally included in a laser irradiation device (not shown). In this regard, the laser irradiation device may further include a lens between the light source 100 and the mask 200 and/or the mask 200 and the donor film 300.

An organic layer pattern is formed by the transferring process to the acceptor substrate 400, a second electrode is formed on the organic layer pattern, and then an organic light emitting device is completed.

FIGS. 5 through 8 are cross-sectional views for explaining a method of manufacturing an organic light emitting device by using a LITI method according to an embodiment of the present invention. And FIG. 10 is a flow chart for explaining a method of manufacturing an organic light emitting device by using a LITI method according to an embodiment of the present invention.

Figure 5:
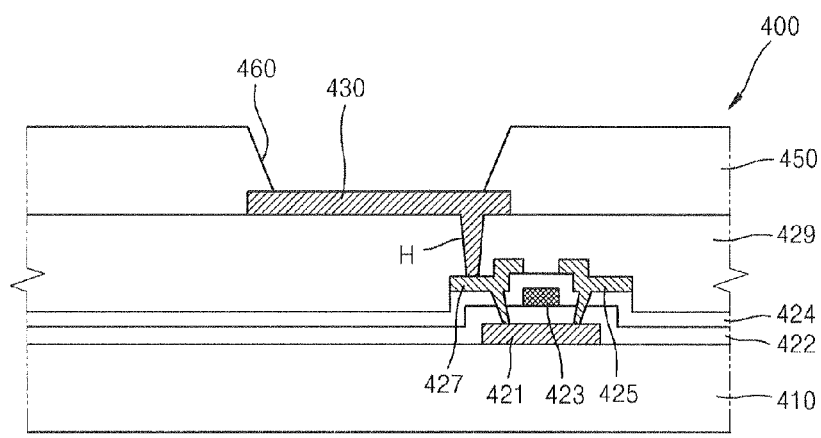
FIGS. 5 through 9 are cross-sectional views for explaining a method of manufacturing an organic light emitting device by using a LITI method according to an embodiment of the present invention.
Figure 10:
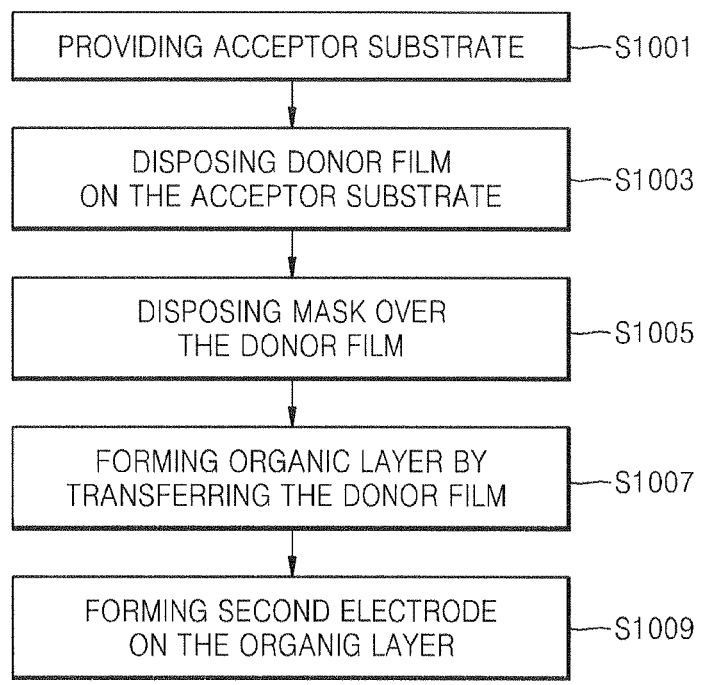
FIG. 10 is a flow chart for explaining a method of manufacturing an organic light emitting device by using a LITI method according to an embodiment of the present invention.

Referring to FIGS. 5 and 10, the acceptor substrate 400 is prepared (S1001). The first electrode 430 is formed on an upper portion of the substrate 410. The pixel definition layer 450 including an opening portion 460 through which the first electrode 430 is exposed is formed on the upper portion of the substrate 410.

The acceptor substrate 400 may include a passive matrix organic light emitting display device or an active matrix organic light emitting display device. In the present embodiment, the acceptor substrate 400 is the active matrix organic light emitting display device.

When the acceptor substrate 400 is the active matrix organic light emitting display device, the acceptor substrate 400 may further include a TFT in a lower portion of the first electrode 430.

The substrate 410 may be formed of a transparent glass material having SiO$_2$ as a main component. However, the present invention is not limited thereto, and the substrate 410 may be formed of various materials, such as a plastic material or a metal material.

An insulation layer (not shown) that functions as a barrier layer and/or a buffer layer for planarizing the surface of the substrate 410 and preventing impurity ions from spreading and preventing moisture or external air from being penetrated may be further deposited onto an upper portion of the substrate 410 before a TFT is formed. The insulation layer may use SiO$_2$ and/or SiNx, and may be deposited by using various deposition methods, such as a plasma enhanced chemical vapor deposition (PECVD) method, an atmospheric pressure CVD (APCVD) method, a low pressure CVD (LPCVD) method, etc.

An active layer 421 of the TFT is formed on the upper portion of the substrate 410. The active layer 421 of the TFT may be formed by depositing and crystallizing amorphous silicon on the upper portion of the substrate 410, forming a polycrystalline silicon layer (not shown) and patterning the polycrystalline silicon layer. The active layer 421 of the TFT includes source and drain regions that are formed in an edge of the active layer 421 and correspond to both sides of a gate electrode 423 by doping n type or p type impurities, and a channel region between the source and drain regions.

A gate insulation layer 422 is formed on the active layer 421 of the TFT. The gate insulation layer 422 may deposit an inorganic insulation layer, such as SiNx or SiOx by using the (PECVD) method, the APCVD method, the LPCVD method, etc.

The gate electrode 423 is formed on the gate insulation layer 422. An interlayer insulation layer 424 is formed on the gate insulation layer 422 to cover the gate electrode 423.

The gate electrode 423 may be formed of various conductive materials. The gate electrode 423 may be a single layer or a multilayer formed of any one selected from a group consisting of molybdenum (Mo), aluminum (Al), chrome (Cr), gold (Au), titanium (Ti), nickel (Ni), neodymium (Nd), and copper (Cu) or an alloy thereof. However, the present invention is not limited thereto. When elements other than the active layer 421 of the TFT need to pass light, the gate electrode 423 may be formed of various transparent conductive materials, such as ITO or IZO.

Source and drain electrodes 425 and 427 formed on the interlayer insulation layer 424 are connected to the active layer 421 through a contact hole. The source and drain electrodes 425 and 427 may be a single layer or a multilayer formed of any one selected from a group consisting of molybdenum (Mo), aluminum (Al), chrome (Cr), gold (Au), titanium (Ti), nickel (Ni), Neodymium (Nd), and copper (Cu) or an alloy thereof. However, the present invention is not limited thereto.

A planarization layer 429 is formed to cover the source and drain electrodes 425 and 427. The planarization layer 429 may use an inorganic insulation layer and/or an organic insulation layer. The inorganic insulation layer may include SiO$_2$, SiNx, SiON, Al$_2$O$_3$, TiO$_2$, Ta$_2$O$_5$, HfO$_2$, ZrO$_2$, BST, PZT, etc. The organic insulation layer may include general-purpose polymer (PMMA, PS), a polymer derivative including a phenol group, acrylic polymer, imidic polymer, aryl-etheric polymer, amidic polymer, fluoric polymer, p-zylenic polymer, vinyl alcoholic polymer, and blends thereof. The planarization layer 429 may be formed as a composite deposition layer of the inorganic insulation layer and the organic insulation layer.

The present invention is not limited to the deposition structure of the TFT described above, and the TFT may have various structures. Although a top gate TFT is exemplified in the present embodiment, different types of TFT may be exemplified. Further, the TFT may be an oxide TFT that uses an oxide semiconductor as the active layer 421.

The first electrode 430 that is a pixel electrode of the organic light emitting device is formed on an upper portion of the planarization layer 429, and is electrically connected to the source and drain electrodes 425 and 427 through a via hole H. The via hole H is formed by etching the planarization layer 429 and exposing the source and drain electrodes 425 and 427.

The first electrode 430 may be formed of various conductive materials per pixel. If a display device is a bottom emission type in which an image is formed in a direction of the substrate 410, the first electrode 430 may be a transparent electrode, and may be formed of ITO, IZO, ZnO, or In$_2$O$_3$ having a high work function. If the display device is a top emission type in which the image is formed in an opposite direction of the substrate 410, the first electrode 430 may include a reflective electrode by forming a reflective layer formed of Ag, Mg, Al, Pt, Pd, Au, Ni, Nd, Ir, Cr, Li, Ca and a compound thereof and forming ITO, IZO, ZnO, or In$_2$O$_3$ having a high work function on the reflective layer. The first electrode 430 may be an anode or a cathode.

Thereafter, the pixel definition layer 450 is formed by depositing an insulation layer on the first electrode 430 and an entire surface of the substrate 410, patterning the insulation material, and forming the opening 460 through which a center of the first electrode 430 is exposed. The insulation material may be an organic material or an inorganic material. The organic material may include one selected from a group consisting of photosensitive resin, such as benzocyclobutene (BCB), acrylic photoresist, phenolic photoresist, polyimdic photoresis, etc. However, the present invention is not limited thereto. The inorganic material may include at least one inorganic insulation material selected from a group consisting of SiO$_2$, SiNx, Al$_2$O$_3$, CuOx, Tb4O7, Y$_2$O$_3$, Nb$_2$O$_5$, Pr$_2$O$_3$, etc. by using a sputtering method, a CVD method, a deposition method, etc. A thickness of the pixel definition layer 450 may be determined according to uniformity of a layer, efficiency of LITI energy, and an effective transfer of a light emission layer.

Figure 6:
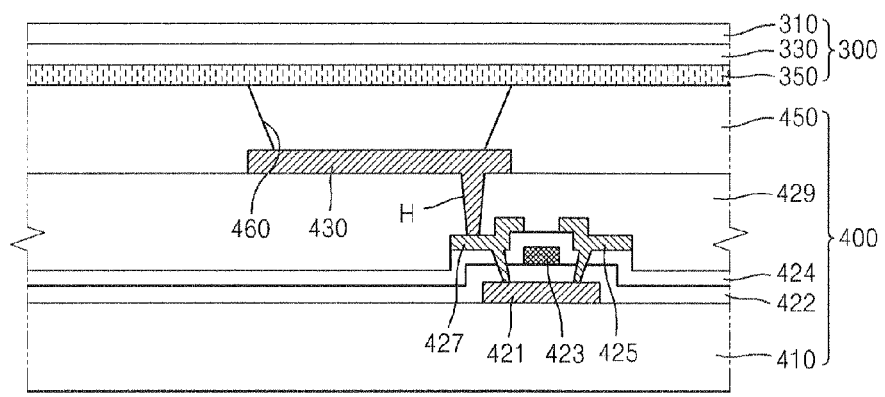

Referring to FIGS. 6 and 10, the donor film 300 corresponding to the acceptor substrate 400 is disposed (S1003).

The donor film 300 includes the base film 310, the LTHC layer 330, and the transfer layer 350. One surface of the transfer layer 350 is disposed on the upper portion of the acceptor substrate 400. A pixel region of the acceptor substrate 400 and the transfer layer 350 of the donor film 300 are spaced to face each other and are uniformly laminated. Such lamination is performed by pressing the pixel region and the transfer layer 350 by using a roller, a gas press, or a crown press. The lamination may be performed from the center to the edge. The lamination may be performed in a single direction.

The sputtering method may be used to form the LTHC layer 330 and the transfer layer 350 on the base film 310. However, the present invention is not limited thereto.

Since a laser beam applied onto the base film 310 is delivered to the LTHC layer 330, the base film 310 is generally formed of a transparent material, and must have an optical property and sufficient mechanical stability as a support film. For example, the base film 310 may be formed of at least one polymer material selected from a group consisting of polyethyleneterephthalate, polyester, polyacryl, polyepoxy, polyethylene, and polystyrene, or may be formed as a glass substrate.

The LTHC layer 330 may include an optical absorption material used to absorb light. The LTHC layer 330 may be a metal layer formed of Al, Ag, an oxide and a sulfide thereof, or an organic layer formed of polymer including carbon black, graphite, or an infrared ray pigment. The metal layer may be formed by using a vacuum deposition method, an electron beam deposition method, or a sputtering method. The organic layer may be foamed by using one of general film coating methods, such as roll coating, gravure, pressing, spin coating, and knife coating.

The transfer layer 350 may be formed of a polymer organic material or a small-molecule organic material. The transfer layer 350 may be one single layer or one or more multilayers selected from a group consisting of a hole injecting layer (HIL), a hole transporting layer (HTL), an electroluminescent layer (ELL), a hole blocking layer (HBL), an electron transporting layer (ETL), and an electron injecting layer (EIL). The EIL, the ETL, the ELL, the HTL, and the HIL may be used as the transfer layer 350 as long as they are formed of any general materials. The transfer layer 350 may be formed by using one of general coating methods, such as pressing, spin, knife coating, vacuum deposition, CVD, etc.

An intermediate layer (not shown) that is formed of an acrylic resin or alkyd resin may be disposed between the LTHC layer 330 and the transfer layer 350 so as to increase transfer characteristics and prevent the transfer layer 350 from being contaminated.

The donor film 300 may include multipurpose layers, in addition to the base film 310, the LTHC layer 330, and the transfer layer 350, and may change a stack structure according to purposes.

Figure 7:
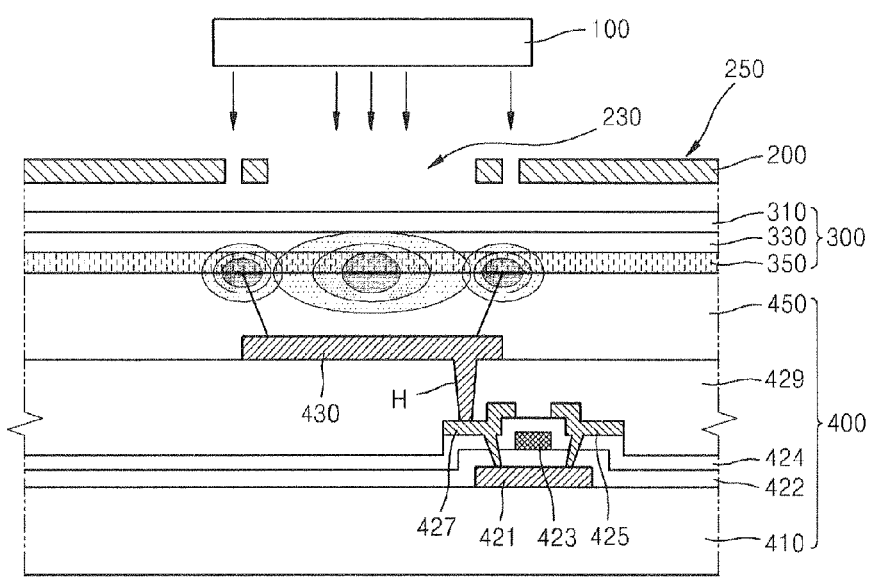

Referring to FIGS. 7 and 10, the mask 200 is located on the donor film 300, and a laser beam is transmitted onto the mask 200 (S1005).

The opening portion 230 of the mask 200 and the opening portion 460 through which the first electrode 430 formed on the acceptor substrate 400 is exposed are disposed to correspond to each other. In this regard, the mask 200 and the donor film 300 that are disposed on the acceptor substrate 400 may completely contact each other or may be spaced apart from each other by more than several micro-meters or several millimeters.

The mask 200 includes the opening portion 230 and the shielding portion 250.

The opening portion 230 includes the first opening portion 210 that is the same as or smaller than the opening portion 460 through which the first electrode 430 is exposed and the second opening portions 220 that is formed to the left and right of the first opening portion 210 in a direction in which the laser beam is scanned as shown in FIGS. 4A through 4C. The second opening portions 220 may be formed as a plurality of slits as shown in FIGS. 4D through 4F. In this regard, lengths of the second opening portions 220 may be patterned to be the same as or longer than that of the first opening portion 210.

A laser dose per unit area that passes through the second opening portions 220 is higher than a laser dose per unit area that passes through the first opening portion 210. If the lengths of the second opening portions 220 are longer than that of the first opening portion 210, the laser dose per unit area of an edge of a pixel may be increased.

The shielding portion 250 uses a non-penetration and non-absorption material with respect to the laser beam, thereby blocking or reflecting the laser beam when the laser beam is irradiated.

If the laser beam emitted from the light source 100 is applied onto the mask 200, the laser beam passes through the opening portion 230 of the mask 200 and is scanned in the upper portion of the donor film 300. When the LTHC layer 330 of a region, which is irradiated with the laser beam, is heated and expands, the transfer layer 350 expands and is separated from the donor film 300, and the transfer layer 350 is transferred to the upper portion of the first electrode 430 of the acceptor substrate 400, and thus an organic layer 500 is formed.

In this regard, the laser beam may use a linear beam that scans the acceptor substrate 400 and the donor film 300 that are conducted to each other by lines (colors) in a longitudinal direction of a pixel and irradiates a laser beam. The laser beam may be applied one time or more than one time. The laser beam may be applied while the light source 100 is fixed and the acceptor substrate 400 moves, or while the acceptor substrate 400 is fixed and the light source 100 moves. The laser beam may be applied in a direction perpendicular to or at an incline to a plane of the acceptor substrate 400.

A process of transferring and forming the organic layer 500 may be performed in a nitrogen ($N_2$) atmosphere. Since the transferred organic layer 500 may be oxidized due to an oxygen component contained in the atmosphere, the process of transferring the organic layer 500 may be performed in a nitrogen atmosphere without the oxygen component. Further, the process of transferring and forming the organic layer 500 may be performed in a vacuum atmosphere. In this case, when the donor film 300 is laminated over the entire surface of the acceptor substrate 400, foam is prevented from being generated between the donor film 300 and the acceptor substrate 400.

Figure 8:
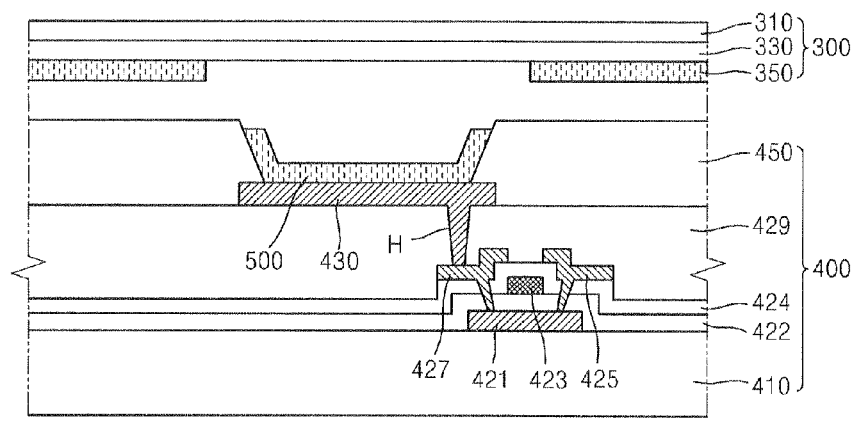

Referring to FIGS. 8 and 10, the organic layer 500 is formed on the acceptor substrate 400 by applying the laser beam and transferring the transfer layer 350 of the donor film 300 onto the first electrode 430 (S1007).

The LTHC layer 330 of the donor film 300 absorbs the laser and generates heat. The heat reduces an adhesive strength between the transfer layer 350 and the LTHC layer 330 so that the transfer layer 350 is transferred onto the acceptor substrate 400. As a result, the organic layer 500 is formed on the first electrode 430 of the acceptor substrate 400.

The organic layer 500 formed by using the donor film 300 includes at least the ELL, and may include at least one of the HIL, the HTL, the HBL, the ETL, and the EIL.

The HIL may facilitate injection of a hole from the first electrode 430 to the ELL, and may include one or more selected from the group consisting of CuPc (cupper phthalocyanine), PEDOT (poly(3,4)-ethylenedioxythiophene), PANI (polyaniline), and NPD (N,N-dinaphthyl-N,N'-diphenyl benzidine). However, the present invention is not limited thereto.

The HTL may facilitate transport of a hole, and may have different deposition and coating conditions according to a used compound within the almost same condition range as the HIL. The HTL may include one or more selected from the group consisting of NPD (N,N-dinaphthyl-N,N'-diphenyl benzidine), TPD (N,N'-bis-(3-methylphenyl)-N,N'-bis-(phenyl)-benzidine), s-TAD, and MTDATA (4,4',4"-Tris(N-3-methylphenyl-N-phenyl-amino)-triphenylamine). However, the present invention is not limited thereto.

The ELL may be formed of a red, green, blue, and white light emission material, and a phosphorescent or fluorescent material.

If the ELL is formed of the red light emission material, the ELL includes a host material including CBP (carbazole biphenyl) or mCP (1,3-bis(carbazol-9-yl), may be formed of the phosphorescent material including one or more dopants selected from the group consisting of PIQIr (acac)(bis(1-phenylisoquinoline)acetylacetonate iridium), PQIr (acac)(bis(1-phenylquinoline)acetylacetonate iridium), PQIr (tris (1-phenylquinoline)iridium), and PtOEP (octaethylporphyrin platinum), and may be formed of the fluorescent material including PBD:Eu(DBM)3(Phen) or Perylene. However, the present invention is not limited thereto.

If the ELL is formed of the green light emission material, the ELL includes the host material including CBP or mCP, may be formed of a phosphorescent material including a dopant of Ir(ppy)3(fac tris(2-phenylpyridine)iridium), or may be formed of a fluorescent material including Alq3(tris (8-hydroxyquinolino)aluminum). However, the present invention is not limited thereto.

If the ELL is formed of the blue light emission material, the ELL includes the host material including CBP or mCP, and may be formed of a phosphorescent material including a dopant of $(4,6-F2\ ppy)_2Irpic$.

The ELL may be formed of a phosphorescent material including one selected from the group consisting of Spiro-DPVBi, spiro-6P, distilbenzene (DSB), distyrylarylene (DSA), PFO polymer, and PPV polymer. However, the present invention is not limited thereto.

The ETL may facilitate transport of an electron to provide an efficient transport of the electron, and may be formed of one or more selected from the group consisting of Alq3(tris (8-hydroxyquinolino)aluminum), PBD, TAZ, Spiro-PBD, BAlq, and SAlq. However, the present invention is not limited thereto.

The ETL may function as a hole prevention layer that prevents a hole injected from the first electrode 430 from moving to a second electrode through the ELL to efficiently couple the hole and an electron in the ELL. The hole prevention layer may be further formed by using a hole prevention material between the ETL and the ELL. The hole prevention material, although not particularly limited, must have an electron transport capability and an ionization potential higher than a light emission compound, and may use Balq, BCP, TPBI, etc.

The EIL may facilitate injection of an electron, and may use Alq3(tris(8-hydroxyquinolino)aluminum), PBD, TAZ, Spiro-PBD, BAlq, or SAlq. However, the present invention is not limited thereto.

Figure 9:
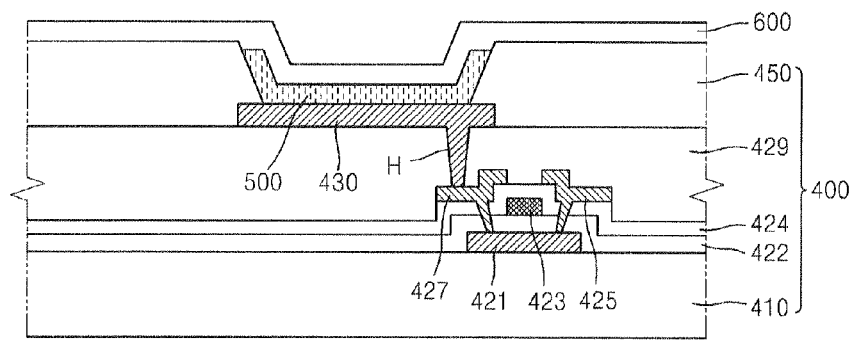

Referring to FIGS. 9 and 10, the second electrode (600) is formed on an upper portion of the organic layer 500 (S1009) and thus the organic light emitting device is completely manufactured. In this regard, the second electrode may be a cathode electrode or an anode electrode. If a display device is a bottom emission type in which an image is formed in a direction of the substrate 410, the second electrode may be a reflective electrode. In this regard, the reflective electrode may be formed by depositing a metal having a small work function, for example, Ag, Mg, Al, Pt, Pd, Au, Ni, Nd, Ir, Cr, Li, Ca, LiF/Ca, LiF/Al, or a compound thereof in a thin manner. If the display device is a top emission type in which an image is formed in an opposite direction to the substrate 410, the second electrode is a transparent electrode.

Although a mask including a center opening portion and additional left and right opening portions is exemplified in the embodiments described above, the present invention is not limited thereto, and a mask that transfers a laser beam onto a part of a pixel region and a pixel definition layer of an edge of the pixel may be used.

According to the present invention, a mask including an opening corresponding to an edge of a pixel region is used to form an organic layer in an upper portion of a substrate of an organic light emitting device, thereby transferring the organic layer to an edge of the pixel region.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of manufacturing an organic light emitting device, the method comprising:
   providing an acceptor substrate including a first electrode and a pixel defining layer defining a pixel, the first electrode being exposed through an opening of the pixel defining layer;
   disposing a donor film on an upper portion of the acceptor substrate;
   disposing a mask on the donor film, the mask having an opening that includes a first opening and a second opening, the second opening being separated from the first opening with a shielding portion of the mask disposed between the first opening and the second opening, the first opening covering the pixel, the shielding portion of the mask disposed between the first opening and the second opening covering a portion of the pixel defining layer formed at an edge of the pixel, the second opening covering another portion of the pixel defining layer formed at the edge of the pixel; and
   forming an organic layer by applying a laser beam to the mask and transferring a transfer material of the donor film onto the first electrode.

2. The method of claim 1, wherein the opening of the mask comprises another second opening, the first opening disposed between the second opening and said another second opening, said another second opening being separated from the first opening with another shielding portion of the mask disposed between the first opening and said another second opening.

3. The method of claim 2, wherein the second opening includes a plurality of slits.

4. The method of claim 2, wherein the second opening is longer than the first opening in the direction in which the laser beam is scanned.

5. The method of claim 1, wherein a laser dose per unit area, which is transmitted to the edge of the pixel, is higher than a laser dose per unit area, which is transmitted to the pixel.

6. The method of claim 1, wherein the disposing of the donor film on the upper portion of the acceptor substrate comprises laminating the donor film on the acceptor substrate.

7. The method of claim 1, wherein the donor film comprises:
   a base film;
   a light to heat conversion (LTHC) layer to be formed in one surface of the base film, to absorb light, and to convert the light into heat; and
   a transfer layer formed in one surface of the LTHC layer by using the transfer material.

8. The method of claim 7, wherein the transfer layer is one single layer or one or more multilayers selected from the group consisting of a hole injecting layer (HIL), a hole transporting layer (HTL), an electroluminescent layer (ELL), a hole blocking layer (HBL), an electron transporting layer (ETL), and an electron injecting layer (EIL).

9. The method of claim 1, wherein the disposing of the mask comprises disposing the mask to directly contact the donor film or to be spaced apart from the donor film.

10. The method of claim 1, further comprising forming a second electrode on the organic layer.

11. The method of claim 1, wherein the laser beam is a linear laser beam.

* * * * *